US009800088B2

(12) United States Patent
Voloh et al.

(10) Patent No.: US 9,800,088 B2
(45) Date of Patent: Oct. 24, 2017

(54) METHOD AND SYSTEM FOR HIGH-SPEED POWER SOURCE TRANSFER (HS-PST)

(71) Applicant: General Electric Company, Schenectady, NY (US)

(72) Inventors: Ilia Voloh, Markham (CA); Mitalkumar G. Kanabar, Markham (CA); Tarlochan Sidhu, Atlanta, GA (US); Mohammad Dadash Zadeh, Atlanta, GA (US); Amin Zamani, Mississauga (CA)

(73) Assignee: General Electric Company, Schenectady, NY (US)

( * ) Notice: Subject to any disclaimer, the term of this patent is extended or adjusted under 35 U.S.C. 154(b) by 385 days.

(21) Appl. No.: 14/673,316

(22) Filed: Mar. 30, 2015

(65) Prior Publication Data

US 2016/0294212 A1    Oct. 6, 2016

(51) Int. Cl.
| | |
|---|---|
| *G01R 21/133* | (2006.01) |
| *H02J 9/06* | (2006.01) |
| *H02J 3/00* | (2006.01) |

(52) U.S. Cl.
CPC ............ *H02J 9/061* (2013.01); *G01R 21/133* (2013.01); *H02J 3/005* (2013.01); *Y02E 40/10* (2013.01)

(58) Field of Classification Search
CPC ......... H02J 3/005; G01R 21/133; Y02E 40/10
USPC ........................................................ 307/87
See application file for complete search history.

(56) References Cited

U.S. PATENT DOCUMENTS

| | | |
|---|---|---|
| 5,502,340 A | 3/1996 | Schuster |
| 5,761,073 A | 6/1998 | Dickson |
| 7,468,593 B2 | 12/2008 | Yalla et al. |
| 7,589,438 B2 | 9/2009 | Galm |
| 8,373,309 B2 | 2/2013 | Qin |

OTHER PUBLICATIONS

M. V. V. S. Yalla, Design of a high-speed motor bus transfer system; IEEE Transaction on Industry Applications, vol. 46, No. 2, pp. 612-619, Mar./Apr. 2010.
J. Gardell, D. Fredrickson, Motor bus transfer applications issues and considerations; J9 working group report to the Rotating Machinery Protection Subcommittee of the IEEE Power System Relay Committee, pp. 1-61, May 2012.

*Primary Examiner* — Robert Deberadinis
(74) *Attorney, Agent, or Firm* — Cynthia R. Parks; Parks IP Law LLP (57) ABSTRACT

An electronic device configured to switchover power from a primary source to an alternate source to maintain continuity of power supplied to a load bus. The electronic device includes one or more processors configured to identify availability of the alternate source using source monitoring in order to measure and calculate a tracking frequency for controlling a variable sampling interval of the one or more processors. The processors are configured to store signal samples and associated time stamps into a variable length buffer and store new sample values and associated new time stamps into the fixed length buffer. The processors are configured to determine attributes from samples of the alternate source using the tracking frequency. The processors are configured to execute a source switchover signal when the primary source is unavailable based by comparing load bus attributes to alternate source attributes at an estimated instance of switchover.

20 Claims, 5 Drawing Sheets

METHOD AND SYSTEM FOR HIGH-SPEED POWER SOURCE TRANSFER (HS-PST)

BACKGROUND

The present disclosure relates generally to power source transfer. More specifically, the present disclosure relates to a high-speed power source transfer system that helps maintain power continuity to loads.

In many industries, it is desirable to supply power continuously to critical industrial loads. For instance, it is important in the power and process industry to continuously supply power to induction and synchronous motors on a load bus. In such cases, it is helpful to have a primary power source and an alternative power source selectively electrically coupled to the load bus. For instance, the primary power source and the alternative power source may each include a circuit breaker that can connect/disconnect the power source from the loads on the load bus. By controlling the circuit breakers, a high-speed power source transfer (HS-PST) system controls which power source (e.g., the primary power source or the alternative power source) is powering the loads on the load bus. If, for example, the primary power source loses power, the HS-PST system can quickly change to the alternative power source. However, transferring to the alternative power source without synchronizing the load bus with the alternative source may lead to problems in the industrial processes and rotary machine loads.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, an electronic device is configured to switchover power supplied from a primary source to an alternate source to maintain continuity of power supplied to a load bus. The electronic device includes one or more processors configured to identify availability of the alternate source using source monitoring in order to measure and calculate a tracking frequency for controlling a variable sampling interval of the one or more processors. The one or more processors are configured to obtain signal samples having associated time stamps from the primary source, the alternate source, and the load bus. In an embodiment, the one or more processors store load bus signal samples and associated time stamps of the load bus into a variable length buffer. In certain embodiments, the one or more processors calculate a new time stamp for transferring to a fixed length buffer from a measured load bus signal frequency for applying a dual buffer sampling interval transfer to estimate a new sample value at the calculated new time stamp. In some embodiments, the one or more processors store the new sample value and associated new time stamp into the fixed length buffer. In an embodiment, the one or more processors determine a set of attributes from samples of the alternate source using the tracking frequency and fixed length buffer samples of a load bus supply, wherein the set of attributes comprise a magnitude, an angle, a frequency, a slip, an acceleration, or any combination thereof, and calculate supervising conditions to execute a source switchover signal when the primary source is unavailable based at least in part on comparing the set of load bus attributes to alternate source attributes at an estimated instance of switchover.

In a second embodiment, a non-transitory computer-readable medium includes stored instructions thereon. The instructions are configured to be executed by an electronic device that is configured to switchover power supplied from a primary source to an alternate source to maintain continuity of power supplied to a load bus. The instructions are configured to identify availability of the alternate source using source monitoring in order to measure and calculate a tracking frequency for controlling a variable sampling interval of one or more processors. In some embodiments, the instructions are configured to obtain signal samples having associated time stamps from the primary source, the alternate source, and the load bus. In certain embodiments, the instructions are configured to store load bus signal samples and associated time stamps of the load bus into a variable length buffer. In an embodiment, the instructions are configured to calculate a new time stamp for transferring to a fixed length buffer from a measured load bus signal frequency for applying a dual buffer sampling interval transfer to estimate a new sample value at the calculated new time stamp. In some embodiments, the instructions are configured to store the new sample value and associated new time stamp into the fixed length buffer, determine a set of attributes from samples of the alternate source using the tracking frequency and fixed length buffer samples of a load bus supply, wherein the set of attributes comprise a magnitude, an angle, a frequency, a slip, an acceleration, or any combination thereof, and calculate supervising conditions to execute a source switchover signal when the primary source is unavailable based at least in part on comparing the set of load bus attributes to alternate source attributes at an estimated instance of switchover.

In a third embodiment, an electronic device includes a processor, wherein the processor is configured to measure event attributes associated with a first switchover initiation event, wherein a signal is received from a primary source, an alternative source, a load bus, or any combination thereof, wherein the switchover initiation event comprises switching over power delivered to a load on a load bus from the primary source to the alternative source, determine an update by comparing the event attributes measurement to initial settings, wherein the update is related to the load bus and the alternative source during a second switchover event, wherein the comparison to a magnitude, a phase, a frequency, a slip, an acceleration, or any combination thereof of the alternative source or the load bus, and supervising conditions, and generate a notification that provides recommendations for a device configuration update.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

When transferring from the primary power source to the alternative power source, synchronization and timing between the primary source, load bus, and alternative source are important to not interrupt the industrial rotating machine loads. For instance, a motor on the load bus may have a load connected to a shaft that rotates based on power attributes of the primary power source (e.g., voltage, phase, frequency). As the shaft rotates, the shaft builds/keeps inertia. When the primary power source fails, the power attributes of the primary power source and/or the load bus may not be synchronized with the alternative source (e.g., the primary source and alternative source may operate independently from each other). For instance, the load bus may lead the alternative source in phase by twenty degrees. It may be desirable for the HS-PST to change to the alternative power source after the load bus phase more closely aligns with the phase of the alternative power source (e.g., within 5 degrees of each other). As such, it is desirable to address transferring between sources in such a way that the processes (e.g., motors) on the load bus are uninterrupted.

Figure 1:
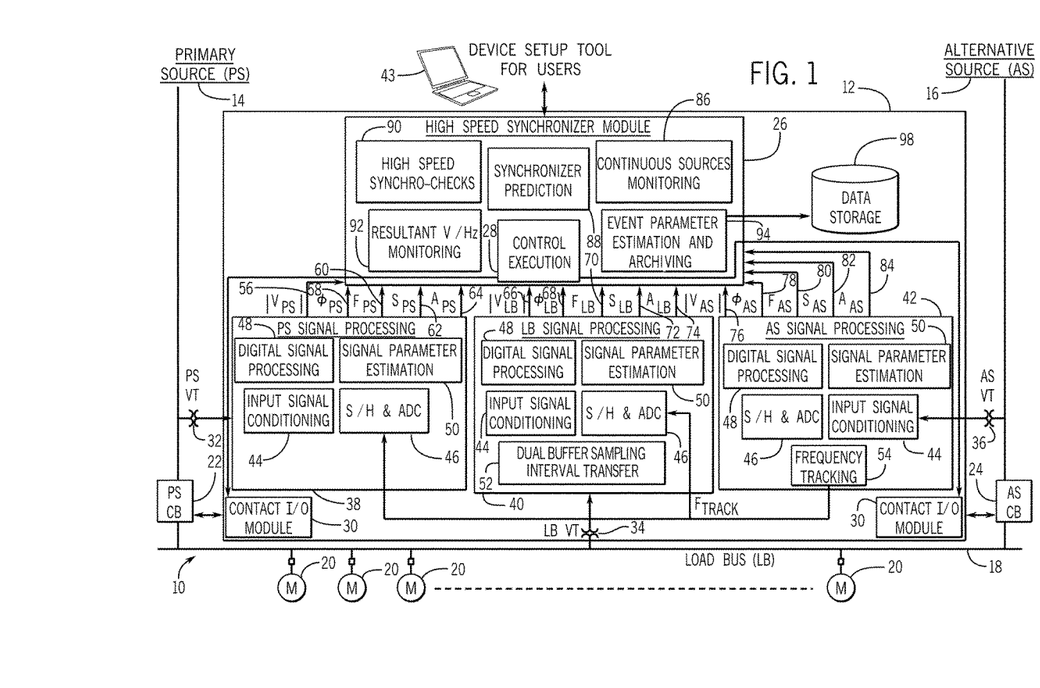
FIG. 1 is a schematic diagram of a system using a high-speed power source transfer system.

Turning to the figures, FIG. 1 is a schematic diagram of a system 10 using a high-speed power source transfer (HS-PST) system 12. The system 10 includes a primary source (PS) 14 and an alternative source 16 (AS) selectively electrically coupled to loads on a load bus 18 (LB), such as, for instance, induction and/or synchronous motors 20. The PS 14 includes a PS circuit breaker 22, and the AS 16 includes an AS circuit breaker 24.

Under typical operating conditions, the PS circuit breaker 22 is closed, thereby enabling the PS 14 to supply power to the loads on the LB 18. Under these conditions, the AS circuit breaker 24 is open. If the PS 14 fails, it may be desirable to transfer power sources from the PS 14 to the AS 16 by closing the AS circuit breaker 24 and opening the PS circuit breaker 22, thereby powering the loads on the LB 18 with the AS 16. That is, the HS-PST system 12 may be configured to switchover power supplied from the PS 14 to the AS 16 to maintain continuity of power supplied to the LB 18.

In order to transfer sources, the HS-PST 12 may be used to communicate open and/or close signals with the PS circuit breaker 22 and the AS circuit breaker 24. Accordingly, a high speed synchronizer 26 of the HS-PST system 12 may provide control execution 28 configured to communicate open and/or close signals with the PS circuit breaker 22 and the AS circuit breaker 24 via contact I/O modules 30 of the high speed synchronizer 26.

To determine whether to open/close the circuit breakers, the HS-PST system 12 may process signals received from the PS 14, AS 16, and LB 18. For instance, a PS voltage transformer 32, a LB voltage transformer 34, and an AS voltage transformer 36 may provide galvanic isolation (e.g., used to isolate where two or more circuits need to communicate with a device, such as the HS-PST system 12, and the circuits may be at different grounds) and enable the HS-PST system 12 to receive signals related to the health of the sources and bus.

More specifically, the HS-PST 12 may include a PS signal processor 38, a LB signal processor 40, and an AS signal processor 42. The PS signal processor 38, LB signal processor 40, and the AS signal processor 42 may process signals received from the PS 14, the LB 18, and the AS 16 respectively. As discussed below, each processing sub-system may receive signals relating to the health of the sources and bus. The high speed synchronizer 26, the PS signal processor 38, the LB signal processor 40, and the AS signal processor 42 each may include a processor or multiple processors, memory, and inputs/outputs. While the systems are depicted as separate systems, alternatively, sub-systems may share a processor or multiple processors and/or memory. The processor(s) may be operatively coupled to the memory to execute instructions for carrying out the presently disclosed techniques. These instructions may be encoded in programs and stored in a tangible non-transitory computer-readable medium, such as the memory and/or other storage. The processor may be a general purpose processor, system-on-chip (SoC) device, or application specific integrated circuit, or some other processor configuration.

Memory, in the embodiment, includes a computer readable medium, such as, without limitation, a hard disk drive, a solid state drive, a diskette, a flash drive, a compact disc, a digital video disc, random access memory (RAM), and/or any suitable storage device that enables the processor(s) to store, retrieve, and/or execute instructions and/or data. Memory may include one or more local and/or remote storage devices.

While FIG. 1 shows the contact I/O modules 30 as a part of the high-speed power source transfer system 12, the contact I/O modules 30 may be separate from the HS-PST system 12. As such, the contact I/O modules 30 may communicate with any suitable wired or wireless communication protocol. For instance, the I/O modules 30 may connect to a network using, for example, a wired Ethernet protocol or a wireless Ethernet protocol.

The high speed synchronizer 26 may communicate with a workstation 43 using any suitable protocol (e.g., wireless or wired protocol). The workstation 43 may allow an operator to configure the high speed synchronizer to the specific set up where the high speed synchronizer is being used. For instance, the workstation 43 may allow the user to specify details about the motors 20 on the LB 18, details about the circuit breakers (e.g., open/close time), details about threshold values used to detect when transfer should take place, or the like. Further, the high speed synchronizer 26 may communicate updates or potential changes to the instructions stored on the high speed synchronizer 26.

The PS signal processor 38 may receive input signals that provide an indication of primary source 14 power attribute values. The input signals may be conditioned 44 (e.g., filtered, amplified, isolated, etc.), converted to digital values using sample-hold and analog-to-digital conversion 46 (S/H & ADC) techniques, processed using, for example, digital signal processing 48 (DSP), and/or estimated using signal parameter estimation 50. The PS signal processor 38 may determine power attribute values, such as a PS voltage magnitude value 56, PS phase value 58, PS frequency value 60, PS slip value 62, and PS acceleration value 64 (e.g., rate of change of the primary source slip value 62). Once the PS voltage magnitude value 56, PS phase value 58, PS frequency value 60, PS slip value 62, and PS acceleration value 64 are determined, the PS signal processor 38 may transmit an indication of the primary source power attribute values to the high speed synchronizer 26.

Similarly, the LB signal processor 40 may receive input signals that provide an indication of the LB 18 power attribute values. The input signals received by the LB signal processor 40 may be conditioned 44 (e.g., filtered, amplified, isolated, etc.), converted to digital values using sample-hold and analog-to-digital conversion 46 (S/H & ADC) techniques, processed using, for example, digital signal processing 48 (DSP), and/or estimated using signal parameter estimation 50. The LB signal processor 40 may determine power attribute values, such as a LB voltage magnitude value 66, LB voltage phase value 68, LB frequency value 70, LB slip value 72, and a LB acceleration value 74 (e.g., rate of change of the LB slip value 72). Additionally, the LB signal processor 40 may receive the frequency from the remaining healthy bus. As further described below, the LB signal processor 40 may perform dual buffer sampling interval transfer 52 by tracking the AS frequency. Once the power attribute values are determined, the values may be sent to the high speed synchronizer 26. In an embodiment, the magnitude of LB signals use a Root-Mean-Square (RMS) value, and the magnitude of the primary and auxiliary supply uses non-recursive full cycle Discrete Fourier Transform (DFT). In some embodiments, one or more processors of the HS-PST system 12 may be configured to calculate the angle (e.g., LB phase value 68) of the LB 18 by utilizing a rotationary recursive Discrete Fourier Transform Likewise, the AS signal processor 42 may receive input signals that provide an indication of AS power attribute values. The input signals received by the AS signal processor 42 may be conditioned 44 (e.g., filtered, amplified, isolated, etc.), converted to digital values using sample-hold and analog-to-digital conversion 46 (S/H & ADC) techniques, processed using, for example, digital signal processing 48 (DSP), and/or estimated using signal parameter estimation 50. The AS signal processor 42 may determine power attribute values, such as an AS voltage magnitude value 76, AS phase value 78, AS frequency value 80, AS slip value 82, and an AS acceleration value 84 (e.g., rate of change of the AS slip value 82). Once the power attribute values are determined, the values may be sent to the high speed synchronizer 26. To determine one or more of the slip values 62, 72, 82, one or more processors may be configured to calculate a first derivative of the measured frequency 60, 70, 80 as the slip. To determine the acceleration 64, 74, 84, the one or more processors may be configured to calculate a second derivative of the measured frequency 60, 70, 80 as the acceleration 64, 74, 84.

Because the LB 18 is connected to a source that is failing, additional processes may be used to find the LB voltage magnitude value 66, LB phase value 68, LB frequency value 70, LB slip value 72, and LB acceleration value 74. As mentioned above, the AS signal processor 42 may transmit an indication of the AS frequency tracking value to the LB signal processor 40 and/or the PS signal processor 38. Frequency tracking (Ftrack) 54 may be obtained from the remaining healthy source (e.g., the AS 16). Frequency tracking is used to resample the LB data at the rate of, for example, the AS frequency 80. As further explained below, frequency tracking 54 on the remaining healthy source may enable measurement of the LB voltage magnitude value 66, LB voltage phase value 68, LB frequency value 70, LB slip value 72, and LB acceleration value 74.

After transitioning to the AS 16, the AS 16 may power the LB 18. When power is restored on the PS 14, the system may transfer back to the PS 14 or continue to receive power from the AS 16. If power is not transferred, eventually the AS 16 may fail and it is desirable to transfer to the PS 14. If the AS 16 is the failing source (e.g., the AS circuit breaker 24 is closed), the PS signal processor 38 may obtain the Ftrack using the PS 14 (e.g., the healthy source). In a further embodiment, adaptive least error square may be used with a look up table of coefficients to calculate LB voltage phase properly. As such, any suitable method may be used to determine the LB power attribute values.

As mentioned above, the high-speed synchronizer 26 may include a processor or processors operatively coupled to memory that enables the processor to store, retrieve, and/or execute instructions and/or data. As such, the high-speed synchronizer may include a tangible non-transitory computer-readable medium having stored instructions thereon. Accordingly, the high-speed synchronizer may include instructions (e.g., software) and/or hardware to perform control execution 28, continuous source monitoring 86, synchronizer predictions 88, high-speed synchro-checks 90, resultant V/Hz monitoring 92, and event parameter estimation & archiving 94. Continuous source monitoring 86 may include monitoring the PS 14, AS 16, and LB 18 for any signs of failures. In an embodiment, the source monitoring 86 comprises continuously monitoring voltage magnitude, frequency, and power quality of the AS 16 within a specified range. One or more of the processors may be configured to identify availability of the AS 16 using source monitoring 86 in order to measure and calculate a tracking frequency (e.g., Ftrack 54) for controlling a variable sampling interval of the one or more processors. Further, the one or more processors may obtain signal samples having associated time stamps from the PS 14, the AS 16, and the LB 18, and/or store LB signal samples and associated time stamps of the LB into a variable length buffer (shown in FIG. 5 as buffer 104). The one or more processor may then store the new sample value and associated new time stamp into the fixed length buffer (shown in FIG. 5 as buffer 108). Further, the one or more processors may determine a set of power attributes from samples of the AS 16 using the tracking frequency (e.g., Ftrack 54) and fixed length buffer samples of a LB supply, wherein the set of power attributes comprises a magnitude (e.g., voltage magnitude value 56, 66, 76), an angle (e.g., phase values 58, 68, 78), a frequency (e.g., frequency values

60, 70, 80), a slip (e.g., slip values 62, 72, 82), an acceleration (e.g., acceleration values 64, 74, 84), or any combination thereof. Then, the one or more processors may calculate supervising conditions to execute a source switchover signal when the PS 14 is unavailable based at least in part on comparing the set of LB power attributes to AS power attributes at an estimated instance of switchover.

Synchronizer prediction 88 may include predicting an open/close time of the PS circuit breaker 22 and/or the AS circuit breaker 24. The high-speed synchro-check 90 may include determining whether power attributes of the AS source and the load bus are synchronized. The resultant V/Hz monitoring 92 may further compare the AS 16 to the LB 18 to prevent any potential damage to machines connected to the LB 18 due to transferring sources. The event parameter estimation & archiving 94 may include revising settings or adapting the HS-PST 12. Event parameter estimation & archiving 94 may involve communication with a data storage 98. The data storage 98 may include memory, a database, or other storage device.

Figure 2:
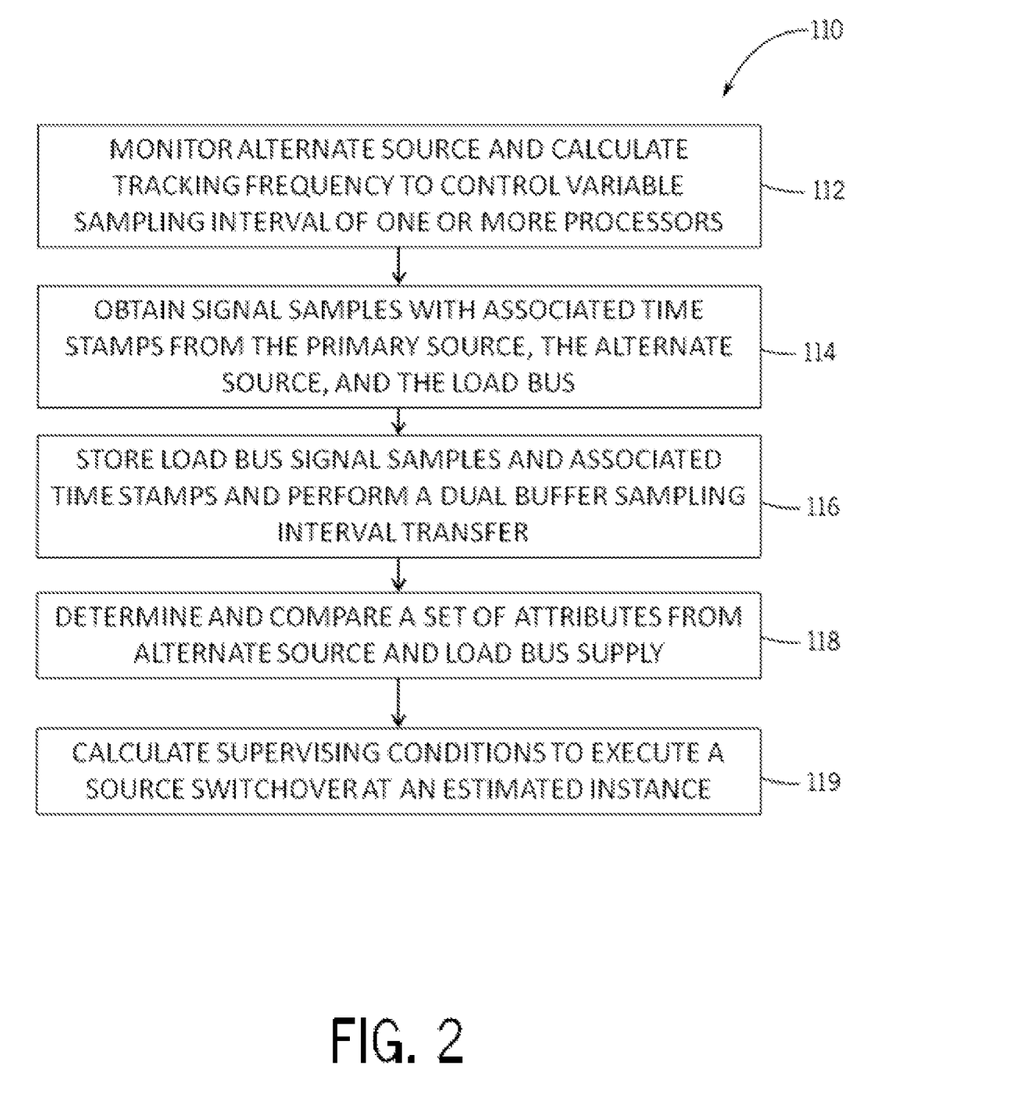
FIG. 2 is a flow diagram illustrating an embodiment of a process and/or instructions useful in performing the high-speed synchro-check of the high-speed power source transfer system of FIG. 1.

FIG. 2 is a flow diagram illustrating an embodiment of a process 110 and/or instructions useful in performing high speed power source transfer. The process 110 may begin by monitoring the AS 16 and calculating tracking frequency (e.g., Ftrack 54) to control variable sampling intervals of one or more processors (block 112). The one or more processors may continue by obtaining signal samples with associated time stamps from the primary source, the alternative source, and the load bus (block 114). The one or more processors (e.g., the LB signal processor 40) may then include storing load bus signal samples and associated time stamps (e.g., in the memory) and performing a dual buffer sampling interval transfer 52 (block 116). Next, the one or more processors may determine and compare a set of power attributes from the AS 16 and the LB 18 supply (block 118). Further, the process 110 may include calculating supervising conditions to execute a source switchover at an estimated instance (block 119).

The high-speed synchro-check 90 may be used to determine whether the signals along the AS 16, and LB 18 are synchronized. More specifically, a processor of the HS-PST 10 (e.g., a processor of the high speed synchronizer module) may be configured to access signals received that provide an indication of the LB power attribute. The LB power attribute may be the LB voltage magnitude 66, phase 68, frequency 70, slip 72, acceleration, or any combination thereof. Further, the processor may be configured to access signals received that provide an indication of an AS power attribute. Similarly, the AS power attribute may be the AS voltage magnitude 76, phase 78, frequency 80, slip 82, acceleration 84, or any combination thereof. The signals may be received while a first circuit breaker (e.g., PS circuit breaker 22) is closed and a second circuit breaker (e.g., AS circuit breaker 24) is open.

The processor performing the high-speed synchro-check 90 may also determine a transfer time based at least in part on the LB power attribute and the AS power attribute. For instance, the transfer time may be based on a comparison or difference between the LB phase 68 and the AS phase 78. The transfer time may provide an indication of a time to perform a transfer from the PS 14 to the AS 16. In addition, other signals may be used to determine the transfer time, such as the LB voltage magnitude value 66, LB frequency value 70, LB slip value 72, LB acceleration value 74, AS voltage magnitude value 76, AS frequency value 80, AS slip value 82, AS acceleration value 84, or any combination thereof. Additionally, synchronizer predictions 88 may be used in determining the transfer time. More specifically, the transfer time may be based at least in part on the time it takes for the first circuit breaker to open and/or the time it takes for the second circuit breaker to close. For instance, both circuit breakers take a total of 100 milliseconds to open/close after receiving the signals from the contact I/O module 30. As such, the transfer time may be based on if the LB phase angle value 68 and the AS phase angle value 78 would fall within a preset range after 100 milliseconds (e.g., after the first circuit breaker opens and the second circuit breaker closes). The preset range may be user programmable or hard coded. As discussed below, the LB signals may be based on frequency tracking using the AS signals. Alternatively, the LB signals may be based on a look up table of coefficients configured for Least Error Square (LES) processing to calculate the LB phase value 68. Then, the processor may generate a circuit breaker signal based on the transfer time. The circuit breaker signal may be configured to open the first circuit breaker and/or close the second circuit breaker to perform the transfer.

The high-speed syncho-checks performs comparisons between voltages, phases, frequencies, slips, and accelerations of the LB 18 and the AS 16. These checks are performed to transfer power when the sources are synchronized in part to ensure that machines are not damaged. Resultant V/Hz monitoring 92 is an additional process of ensuring that settings are desirable for switchover. It involves comparing a combination of the voltage magnitude and phase (e.g., phasor) and the frequency. This may be an important consideration when any one comparison is within the preset range (e.g., the LB voltage magnitude and AS voltage magnitude are within the preset range), but the combination falls outside of the range.

Figure 3:
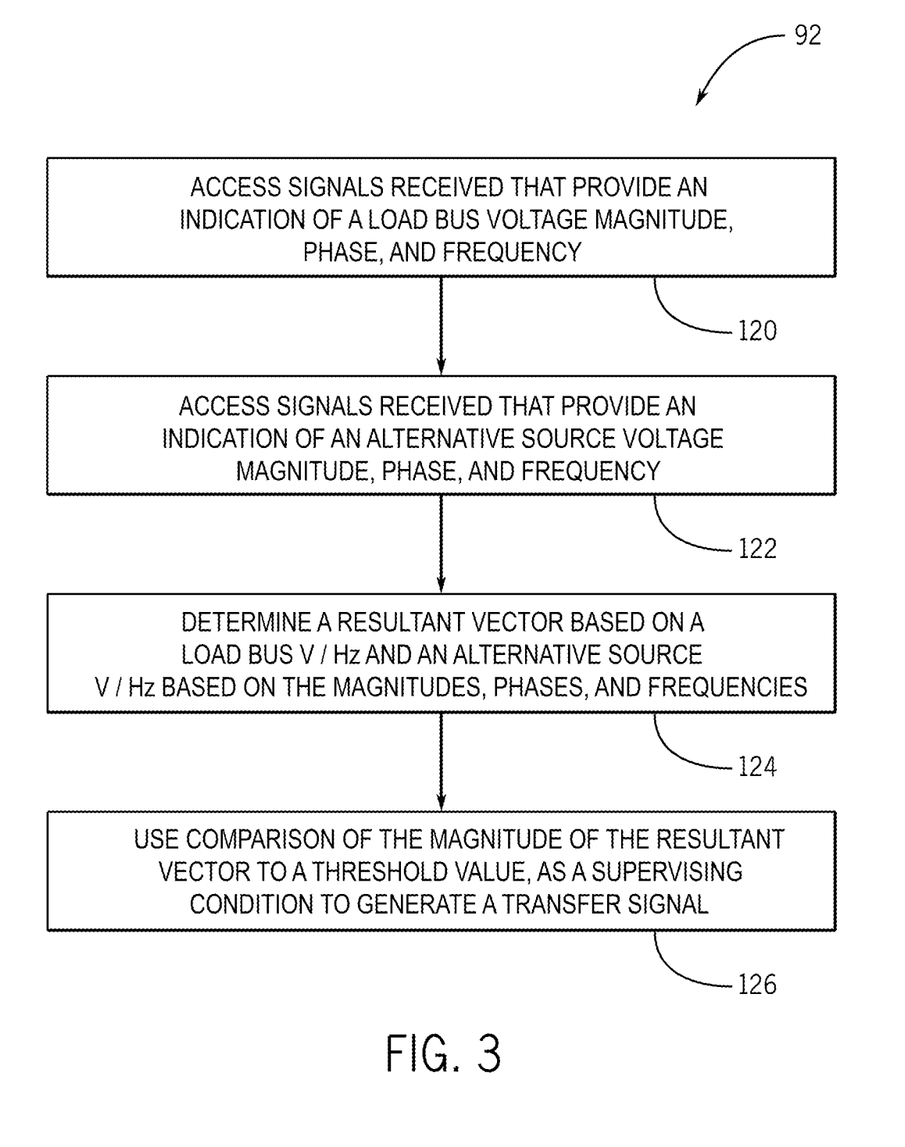
FIG. 3 is a flow diagram illustrating an embodiment of a process and/or instructions useful in performing resultant V/Hz monitoring of the high-speed power source transfer system of FIG. 1.

FIG. 3 is a flow diagram illustrating an embodiment of a process and/or instructions useful in performing resultant V/Hz monitoring 92. Accordingly, the process begins by accessing signals (block 120) received that provide a LB health indication. The health indication may include the LB voltage magnitude value 66, LB phase value 68, and LB frequency value 70. Additionally, the process may include accessing signals (block 122) received that provide a health indication of the AS 16. The health indication AS voltage magnitude 76, AS phase 78, and AS frequency 80.

The process includes determining, via the processor, a resultant vector based on a LB V/Hz and an AS V/Hz (block 124). The LB V/Hz vector may be based on the LB voltage magnitude value 66, the LB phase value 68, and the LB frequency value 70 (e.g., phasor voltage divided by frequency). Similarly, the AS V/Hz may be based on the AS voltage magnitude value 76, AS phase value 78, and AS frequency value 80 (e.g., phasor voltage divided by frequency). The resultant vector may be a difference between the LB V/Hz vector and the AS V/Hz vector. The process may then continue by using a comparison of the magnitude of the resultant vector to a threshold value (e.g., 1.33 per unit), as a supervising condition to generate a transfer signal (block 126). The transfer signal may be configured to control a circuit breaker (e.g., PS circuit breaker 22 and/or AS circuit breaker 24). For instance, if the resultant vector exceeds the threshold value, the transfer signal may provide an indication to keep the AS circuit breaker 24 open and the PS circuit breaker 22 closed. Additionally, if the resultant vector is below the threshold value, the transfer signal may provide an indication to close the AS circuit breaker 24 and open the PS circuit breaker 22, thereby allowing the AS 16 to provide power for the loads on the LB 18. As such, in some embodiments, the one or more processors may calculate supervising conditions including but not limited to a resultant vector based on a LB V/Hz vector and an AS V/Hz vector. The LB V/Hz vector is based on a LB voltage magnitude value 66, a LB phase angle value 68, and a LB frequency value 70. The AS V/Hz vector is based on an AS voltage magnitude value 76, an AS angle value 78, and an AS frequency value 80. As these transfer events occur with circuit breakers opening and closing, information may be captured about each event and used for learning and providing adjustments.

Figure 4:
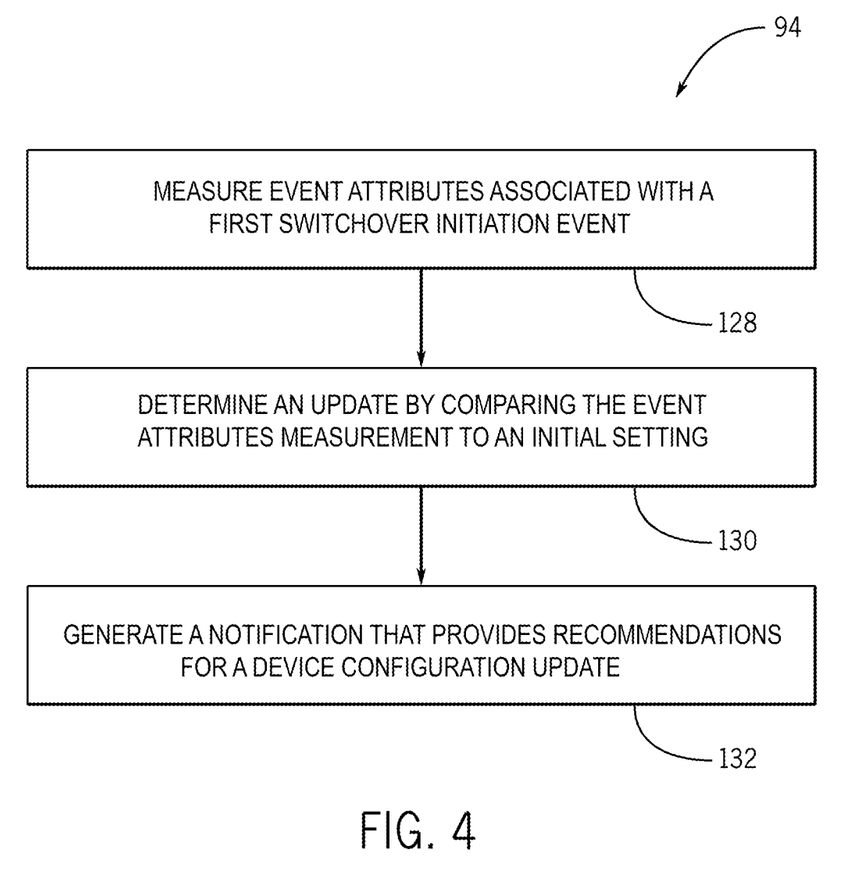
FIG. 4 is another flow diagram illustrating an embodiment of a process and/or instructions useful in performing event parameter estimation and archiving of the high-speed power source transfer system of FIG. 1.

FIG. 4 is another flow diagram illustrating an embodiment of a process and/or instructions useful in performing event attributes estimation and archiving by the HS-PST system 12. The process begins by accessing signals (block 128) received that provide an indication of an event attribute measurement during a first switchover event. Various event attributes during a transfer event may be captured and measured from the PS 14, AS 16, and LB 18. More specifically, event attributes may be tracked and measured related to the voltage magnitude decay rate of the LB 18, the spin-down rates of the LB voltage transformer 34, or circuit breaker open/close time tracking. For instance, one or more processors may be configured to measure event attributes associated with a first switchover initiation event. In some embodiments, a signal is received from the PS 14, the AS 16, the LB 18, or any combination thereof. The switchover initiation event comprises switching over power delivered to the loads 20 on the LB 18 from the PS 14 to the AS 16.

Once the signals are received, the process may continue by determining an update (block 130) by comparing the estimated last event attributes measurement to initial settings. The update may be related to synchronizing the LB 18 with the AS 16 during a second switchover event. For instance, the processors may determine the update (block 130) by comparing the event attributes measurement to initial settings. The update may be related to the LB 18 and the AS 16 during a second switchover event, the comparison to a magnitude, a phase, a frequency, a slip, an acceleration, or any combination thereof of the AS 16 or the LB 18, and supervising conditions.

The event attribute measurement may correspond to a voltage magnitude decay rate of the LB 18. The voltage magnitude decay rate of the LB 18 may be used as an indicator to lessen loads. Additionally and/or alternatively, the event attribute measurement may correspond to a spin-down rate of the LB voltage phase angle 68, LB voltage frequency 70, slip 72, and acceleration 74. The spin-down rate may provide an indication of an opportunity period for closing the AS circuit breaker 24. A faster spin-down rate may indicate that critical components stop operating faster. As mentioned above, the event attribute measurement may also correspond to an open time or close time of the PS circuit breaker 22 and/or the AS circuit breaker 24. As circuit breakers age, the time it takes to close/open the circuit breaker may change. This time is used above when considering synchronization of the sources and bus. As such, it may be beneficial to track CB times. This may be determined based on a difference between the entered circuit breaker operation time and the actual measured circuit breaker operation time (e.g., command initiation time to actual circuit breaker contact open/close time). Once the update is determined, the process continues by generating an update signal that provides an indication of the update. That is, the one or more processors may generate a notification that provides recommendations for a device configuration update (block 132). This notification may be sent to a workstation, may be used in the high speed synchronizer 26, or used in a generated report. If, for instance, the circuit breaker timing has changed, an operator may see the report or the information displayed on the workstation and update the circuit breaker. Alternatively, the high speed synchronizer 26 may use the update signal (e.g., notification) and update the synchronizer prediction 88 information.

In some embodiments, the event attributes include a voltage magnitude decay rate on the LB 18, a spin down of the load on the LB 18, an electrical torque, an operation time of switches available during connection of the AS 16, or any combination thereof. For instance, the spin down may correspond to the phase angle 68, frequency 70, slip 72, acceleration 74, or any combination thereof of the LB 18. In certain embodiments, the event attributes correspond to statistical value related to all event attributes. That is, the statistical value may include a minimum, an average, a maximum, or a standard deviation of event attributes.

Figure 5:
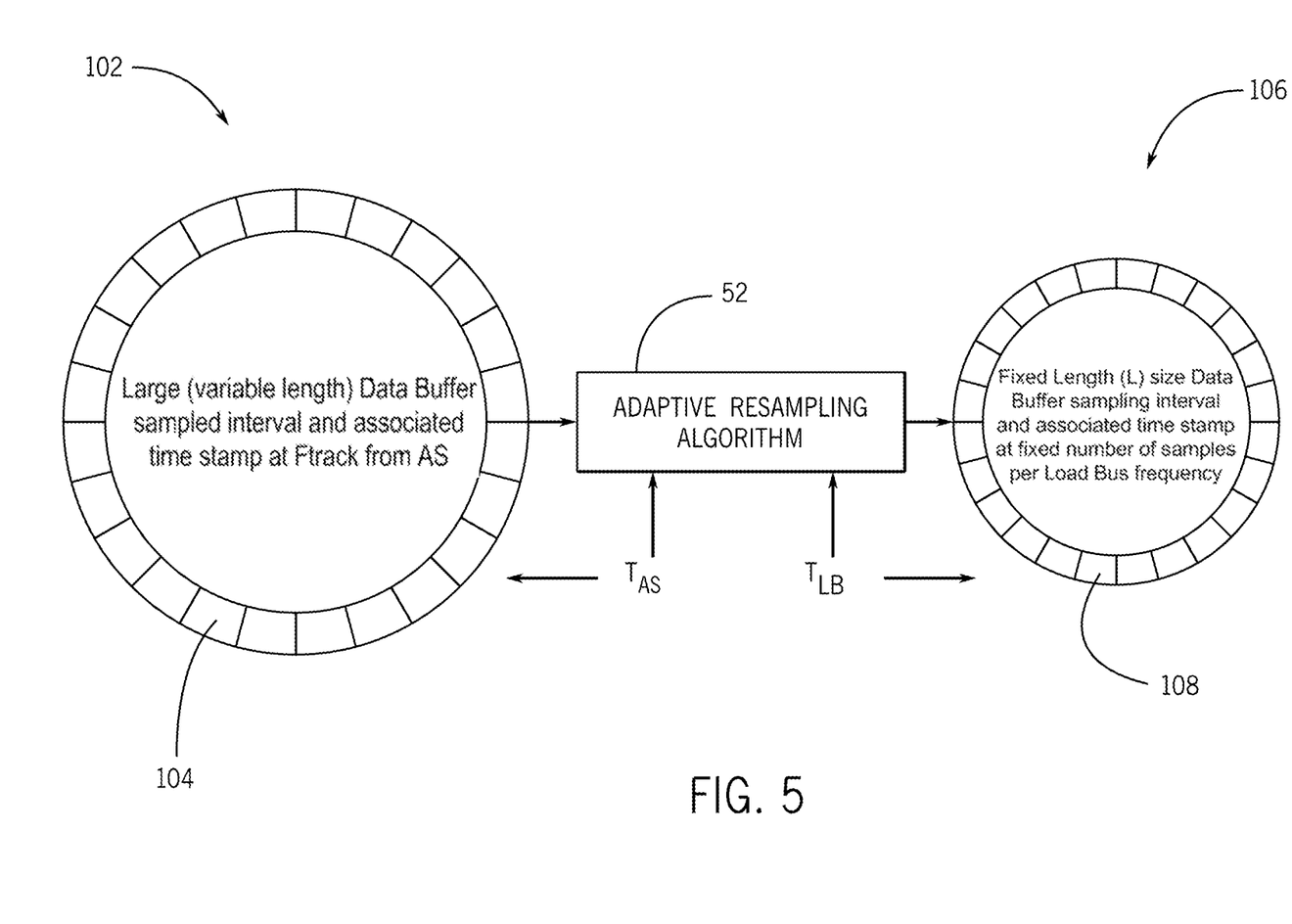
FIG. 5 is a schematic diagram showing the dual buffer sampling interval transfer, as used in the high-speed power source transfer system of FIG. 1.

As the LB frequency 70 decays, the number of samples performed in one cycle of the LB increases. As mentioned above, the LB values may be determined using any suitable method, such as dual buffer sampling interval transfer with frequency tracking or using adaptive least error square with a look up table from frequency tracking. That is, some embodiments may calculate the angle 68 of the LB 18 by applying Least Error Square with a fixed number of coefficients. FIG. 5 is a schematic diagram showing the dual buffer sampling interval transfer. Frequency tracking is obtained from the remaining healthy source (e.g., AS 16). More specifically, the LB signals may be estimated according to the measured LB frequency 70. The LB signals are stored in a large variable length buffer 102 for one cycle of the LB frequency 70. As shown in FIG. 5, a large data buffer 102 may be used with samples based on the frequency tracking from AS 16. The data buffer may include a variable number of bits 104. The estimated data is inserted into a fixed length data buffer 106 sampled interval and associated time stamp at Ftrack 54 from AS 16. Further, in some embodiments, the variable length buffer 102 may be a larger buffer than the fixed length buffer 106. The variable length buffer 102 is configured to adjust the variable sampling interval and associated time stamps based on the tracking frequency. Additionally, the fixed length buffer 106 comprises a predetermined number of samples matching the LB frequency 70 and having associated time stamps. The fixed length size data buffer 106 includes sampling intervals and associated time stamps at fixed number of samples per LB frequency 70. In an embodiment, the new sample value and associated new time stamp is estimated by performing dual buffer sampling interval transfer.

Technical effects of the invention include using a synchronization check that indicates when to perform a high-speed power source transfer. Additionally, the system monitors transferring based on V/Hz between a primary source and an alternative source. Likewise, the system outputs updates to a user or to the system that can improve transferring between power sources. In this manner, sources are transferred when synchronized thereby allowing critical rotating motors to maintain power and continuously rotate. Timing the transfer based on compared power attributes and supervising conditions can prevent damage to the machines connected to the load bus during a switchover.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. An electronic device configured to switchover power supplied from a primary source to an alternate source to maintain continuity of power supplied to a load bus, wherein the electronic device comprises one or more processors configured to:
   identify availability of the alternate source using source monitoring in order to measure and calculate a tracking frequency for controlling a variable sampling interval of the one or more processors;
   obtain signal samples having associated time stamps from the primary source, the alternate source, and the load bus;
   store load bus signal samples and associated time stamps of the load bus into a variable length buffer;
   calculate a new time stamp for transferring to a fixed length buffer from a measured load bus signal frequency for applying a dual buffer sampling interval transfer to estimate a new sample value at the calculated new time stamp;
   store the new sample value and associated new time stamp into the fixed length buffer;
   determine a set of attributes from samples of the alternate source using the tracking frequency and fixed length buffer samples of a load bus supply, wherein the set of attributes comprise a magnitude, an angle, a frequency, a slip, an acceleration, or any combination thereof; and
   calculate supervising conditions to execute a source switchover signal when the primary source is unavailable based at least in part on comparing the set of load bus attributes to alternate source attributes at an estimated instance of switchover.

2. The electronic device of claim 1, wherein the source monitoring comprises continuously monitoring voltage magnitude, frequency, and power quality of the alternate source within a specified range.

3. The electronic device of claim 1, wherein the variable length buffer is a larger buffer than the fixed length buffer, and wherein the variable length buffer is configured to adjust the variable sampling interval and associated time stamps based on the tracking frequency, wherein the fixed length buffer comprises a predetermined number of samples matching load bus frequency and having associated time stamps.

4. The electronic device of claim 1, wherein the new sample value and associated new time stamp is estimated by performing dual buffer sampling interval transfer.

5. The electronic device of claim 1, wherein the magnitude of load bus signals uses a Root-Mean-Square (RMS) value, and the magnitude of the primary and auxiliary supply uses non-recursive full cycle Discrete Fourier Transform (DFT).

6. The electronic device of claim 1, wherein the one or more processors are configured to calculate the angle of the load bus by utilizing a rotationary recursive Discrete Fourier Transform.

7. The electronic device of claim 1, wherein the one or more processors are configured to calculate a first derivative and a second derivative of the measured frequency as the slip and the acceleration, respectively.

8. The electronic device of claim 1, wherein the one or more processors are configured to calculate supervising conditions including but not limited to a resultant vector based on a load bus volts per hertz vector and an alternate source volts per hertz vector, wherein the load bus volts per hertz vector is based on a load bus voltage magnitude value, a load bus phase angle value, and a load bus frequency value, and wherein the alternate source volts per hertz vector is based on an alternate source voltage magnitude value, an alternate source angle value, and an alternate source frequency value.

9. A non-transitory computer-readable medium having stored instructions thereon, wherein the instructions are configured to be executed by an electronic device that is configured to switchover power supplied from a primary source to an alternate source to maintain continuity of power supplied to a load bus, wherein the instructions are configured to:
   identify availability of the alternate source using source monitoring in order to measure and calculate a tracking frequency for controlling a variable sampling interval of one or more processors;
   obtain signal samples having associated time stamps from the primary source, the alternate source, and the load bus;
   store load bus signal samples and associated time stamps of the load bus into a variable length buffer;
   calculate a new time stamp for transferring to a fixed length buffer from a measured load bus signal frequency for applying a dual buffer sampling interval transfer to estimate a new sample value at the calculated new time stamp;
   store the new sample value and associated new time stamp into the fixed length buffer;
   determine a set of attributes from samples of the alternate source using the tracking frequency and fixed length buffer samples of a load bus supply, wherein the set of attributes comprise a magnitude, an angle, a frequency, a slip, an acceleration, or any combination thereof; and
   calculate supervising conditions to execute a source switchover signal when the primary source is unavailable based at least in part on comparing the set of load bus attributes to alternate source attributes at an estimated instance of switchover.

10. The non-transitory computer-readable medium of claim 9, comprising instructions configured to calculate a first derivative and a second derivative of the measured frequency as the slip and the acceleration, respectively.

11. The non-transitory computer-readable medium of claim 10, comprising instructions configured to calculate supervising conditions including but not limited to a resultant vector based on a load bus volts per hertz vector and an alternate source volts per hertz vector, wherein the load bus volts per hertz vector is based on a load bus voltage magnitude value, a load bus phase angle value, and a load bus frequency value, and wherein the alternate source volts per hertz vector is based on an alternate source voltage magnitude value, an alternate source angle value, and an alternate source frequency value.

12. The non-transitory computer-readable medium of claim 9, wherein the magnitude of load bus signals uses a Root-Mean-Square (RMS) value, and the magnitude of the primary and auxiliary supply uses non-recursive full cycle Discrete Fourier Transform (DFT).

13. The non-transitory computer-readable medium of claim 9, wherein the variable length buffer is a larger buffer than the fixed length buffer, and wherein the variable length buffer is configured to adjust the variable sampling interval and associated time stamps based on the tracking frequency, wherein the fixed length buffer comprises a predetermined number of samples matching load bus frequency and having associated time stamps.

14. The non-transitory computer-readable medium of claim 9, wherein the instructions are configured to calculate the angle of the load bus by utilizing a rotationary recursive Discrete Fourier Transform.

15. The non-transitory computer-readable medium of claim 9, wherein the instructions are configured to calculate the angle of the load bus by applying Least Error Square with a fixed number of coefficients.

16. An electronic device, comprising:
a processor, wherein the processor is configured to:
measure event attributes associated with a first switchover initiation event, wherein a signal is received from a primary source, an alternative source, a load bus, or any combination thereof, wherein the switchover initiation event comprises switching over power delivered to a load on a load bus from the primary source to the alternative source;
determine an update by comparing the event attributes measurement to initial settings, wherein the update is related to the load bus and the alternative source during a second switchover event, wherein the comparison to a magnitude, a phase, a frequency, a slip, an acceleration, or any combination thereof of the alternative source or the load bus, and supervising conditions; and
generate a notification that provides recommendations for a device configuration update.

17. The electronic device of claim 16, wherein the event attributes comprise a voltage magnitude decay rate on the load bus, a spin down of the load on the load bus, an electrical torque, an operation time of switches available during connection of the alternate supply, or any combination thereof.

18. The electronic device of claim 17, wherein the spin down corresponds to the phase angle, frequency, slip, acceleration, or any combination thereof of the load bus.

19. The electronic device of claim 16, wherein the event attributes correspond to statistical value related to all event attributes.

20. The electronic device of claim 19, comprising a minimum, an average, a maximum, or a standard deviation of event attributes as the statistical value.

* * * * *